United States Patent
Zaffetti

(10) Patent No.: US 8,931,546 B2
(45) Date of Patent: Jan. 13, 2015

(54) COMPACT TWO SIDED COLD PLATE WITH THREADED INSERTS

(75) Inventor: Mark A. Zaffetti, Suffield, CT (US)

(73) Assignee: Hamilton Sundstrand Space Sytems International, Inc., Windsor Locks, CT (US)

( * ) Notice: Subject to any disclaimer, the term of this patent is extended or adjusted under 35 U.S.C. 154(b) by 1326 days.

(21) Appl. No.: 12/748,576

(22) Filed: Mar. 29, 2010

(65) Prior Publication Data

US 2011/0232864 A1    Sep. 29, 2011

(51) Int. Cl.
| F28F 7/00 | (2006.01) |
| F28F 9/26 | (2006.01) |
| F28F 3/12 | (2006.01) |
| F28F 3/14 | (2006.01) |
| F28F 9/02 | (2006.01) |
| H05K 7/20 | (2006.01) |

(52) U.S. Cl.
CPC .................. *F28F 3/12* (2013.01); *F28F 9/0246* (2013.01); *H05K 7/20254* (2013.01); *H05K 7/20272* (2013.01)
USPC ........... 165/80.4; 165/144; 165/168; 165/170

(58) Field of Classification Search
CPC ..... F28F 3/12; F28F 2220/00; F28F 2250/04; F28F 2275/20; H05K 7/2039; H05K 7/20509; H05K 7/20254
USPC ......... 428/182–186; 165/167, 170, 80.5, 168, 165/80.4, 144; 285/219, 220, 221, 124.5, 285/124.4; 361/702
See application file for complete search history.

(56) References Cited

U.S. PATENT DOCUMENTS

| 255,575 | A | * | 3/1882 | Bopp | 165/174 |
| 1,926,004 | A | * | 9/1933 | Haskins et al. | 165/174 |
| 1,958,899 | A | * | 5/1934 | MacAdams | 165/146 |
| 2,272,863 | A | * | 2/1942 | Young | 165/134.1 |
| 2,752,128 | A | * | 6/1956 | Dedo | 165/155 |
| 4,398,596 | A | * | 8/1983 | Lauro et al. | 165/167 |
| 4,559,580 | A | * | 12/1985 | Lutfy | 361/689 |
| 4,562,512 | A | | 12/1985 | Sutrina | |
| 4,614,227 | A | * | 9/1986 | Vogel | 165/80.4 |
| 4,871,017 | A | * | 10/1989 | Cesaroni | 165/170 |
| 5,088,005 | A | | 2/1992 | Ciaccio | |
| 5,129,447 | A | * | 7/1992 | Hamner | 165/47 |
| 5,269,372 | A | | 12/1993 | Chu et al. | |
| 5,495,889 | A | | 3/1996 | Dubelloy | |
| 5,923,533 | A | | 7/1999 | Olson | |

(Continued)

FOREIGN PATENT DOCUMENTS

| CN | 101301541 | 11/2008 |
| DE | 102006037065 A1 | 2/2008 |
| DE | 102006050256 A1 | 4/2008 |

OTHER PUBLICATIONS

European Search Report for EP Application No. 11250352.9 dated Jan. 27, 2014.

*Primary Examiner* — Allen Flanigan
*Assistant Examiner* — Jason Thompson
(74) *Attorney, Agent, or Firm* — Carlson, Gaskey & Olds, P.C.

(57) ABSTRACT

A structural cold plate assembly includes a support structure including first and second opposite sides supporting corresponding cold plates and an insert. The insert defines a portion of a fluid passage through the support structure and secures the cold plate to the support structure.

13 Claims, 4 Drawing Sheets

(56) References Cited

U.S. PATENT DOCUMENTS

| | | |
|---|---|---|
| 6,191,945 B1 | 2/2001 | Belady et al. |
| 6,349,035 B1 | 2/2002 | Koenen |
| 6,967,064 B2 * | 11/2005 | Haltiner et al. ............... 429/425 |
| 7,000,684 B2 | 2/2006 | Kenny et al. |
| 7,011,149 B2 * | 3/2006 | Fujita et al. .................. 165/173 |
| 7,017,654 B2 | 3/2006 | Kenny et al. |
| 7,024,874 B2 | 4/2006 | Zywiak et al. |
| 7,149,087 B2 | 12/2006 | Wilson et al. |
| 7,188,488 B2 | 3/2007 | Army, Jr. et al. |
| 7,188,662 B2 | 3/2007 | Brewer et al. |
| 7,258,161 B2 | 8/2007 | Cosley et al. |
| 7,353,864 B2 | 4/2008 | Zaffetti et al. |
| 7,523,622 B2 | 4/2009 | Zywiak et al. |
| 7,564,129 B2 | 7/2009 | Nakanishi et al. |
| 2005/0241814 A1 * | 11/2005 | Hendrix et al. ............... 165/167 |
| 2006/0266508 A1 | 11/2006 | Johnson et al. |
| 2007/0131403 A1 * | 6/2007 | Vetrovec et al. .............. 165/168 |
| 2009/0213547 A1 * | 8/2009 | Schulz-Harder et al. ..... 361/702 |

* cited by examiner

COMPACT TWO SIDED COLD PLATE WITH THREADED INSERTS

STATEMENT REGARDING FEDERALLY SPONSORED RESEARCH OR DEVELOPMENT

This subject of this disclosure was made with government support under Contract No.: NNJ06TA25C awarded by National Aeronautics and Space Administration. The Government has certain rights in this invention.

BACKGROUND

This disclosure generally relates to a cooling structure for cooling electronic components. More particularly, this disclosure relates to a cooling structure including a two sided cold plate support assembly.

Electronic components onboard aircraft or other vehicles that operate in extreme temperatures are typically protected from overheating by a cooling device. In some environments, air flow is either not available or insufficient to handle the thermal loads generated by the electronic components. In such applications, a cold plate is utilized through which a cooling fluid flows to remove heat from the electronic component. The cold plate is mounted adjacent the electronic component and supplied with fluid flow through appropriate conduits that lead to a fluid delivery system.

SUMMARY

A disclosed structural cold plate assembly includes a support structure including first and second opposite sides supporting corresponding cold plates and an insert. The insert defines a portion of a fluid passage through the support structure and secures the cold plate to the support structure. The example threaded insert includes a fluid passage for communicating a cooling medium from one cold plate through the support structure to a second cold plate disposed on an opposite side of the support structure.

These and other features disclosed herein can be best understood from the following specification and drawings, the following of which is a brief description.

DETAILED DESCRIPTION

Figure 1:
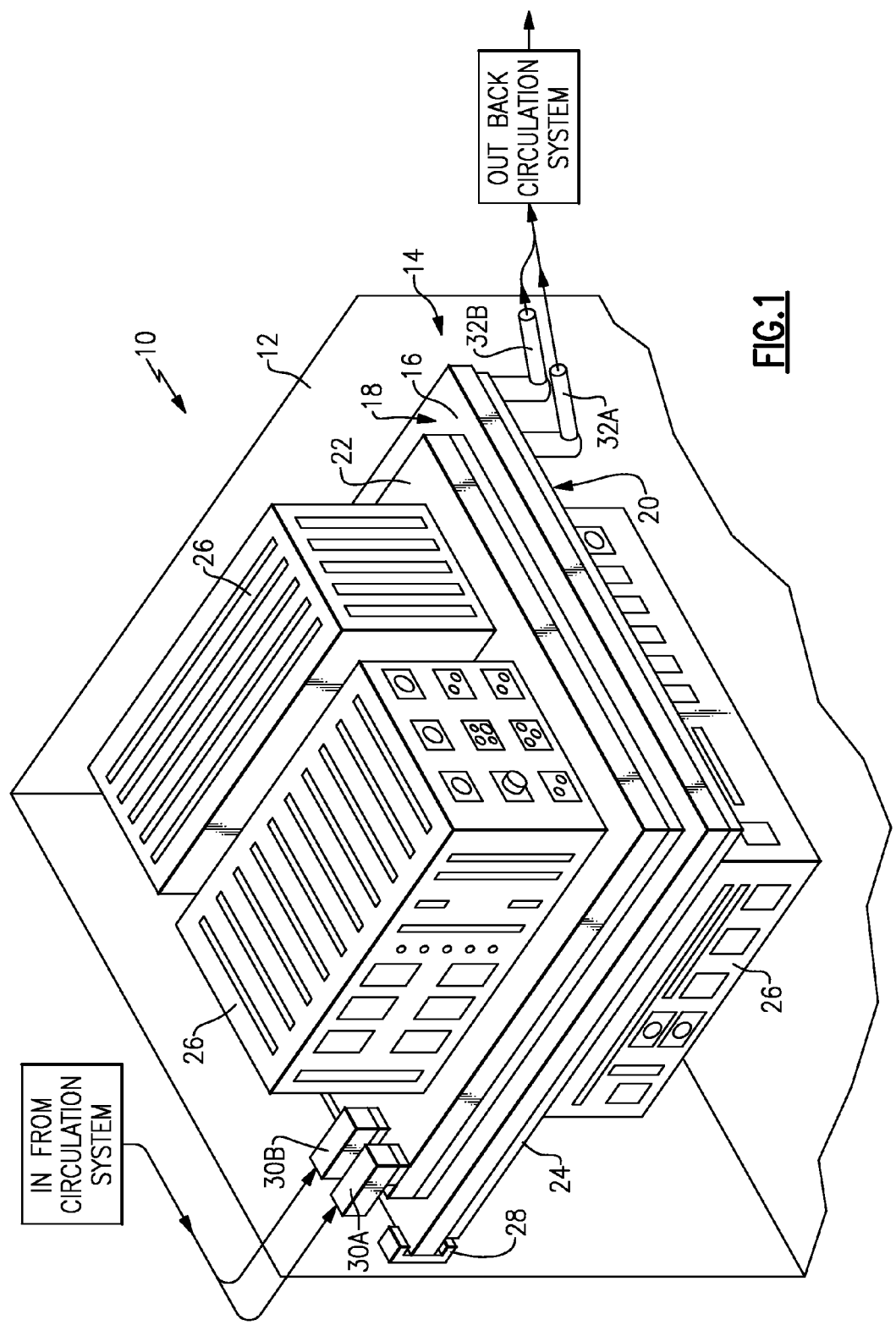
FIG. 1 is a schematic view of an example two sided structural cold plate assembly.

Referring to FIG. 1, an example support assembly 10 includes a fixed structure 12 that supports a structural cold plate assembly 14 for thermally controlling and cooling heat generating devices 26. In the disclosed example, the heat generating devices 26 are electronic devices that generate heat during operation. As appreciated, although electronic devices are described as examples, the disclosed structural cold plate assembly 14 would be useful for any application requiring thermal management.

The example structural cold plate assembly 14 includes a panel 16 that includes a first side 18 and a second side 20. Mounted to the first side 18 is a first cold plate 22 and mounted to the second side 20 is a second cold plate 24. Each of the first and second cold plates 22, 24 define passages through which a cooling medium flows to remove and control heat produced by the devices 26. The panel 16 and thereby the first and second cold plates 22, 24 are supported by at least one mount 28 to the fixed structure 12. The example fixed structure 12 could be a cabinet, wall, bulkhead or other fixed structure that provides a desired location for the devices 26. Moreover, although cold plates 22, 24 are disclosed by way of example, any heat exchanging device could also be utilized and would benefit from the example disclosures.

The first and second cold plates 22, 24 include passages or fluid circuits through which the cooling medium flows to remove heat generated by the devices 26. The devices 26 are mounted in thermal contact with each of the cold plates 22, 24 such that thermal energy is transferred through the cold plates 22, 24 to the fluid medium. In the disclosed example, the devices 26 are mounted on the corresponding cold plates 22, 24. However, other mounting configurations that place the cold plate in thermal contact with the devices 26 are within the contemplation of this disclosure.

The cooling medium is supplied through inlets 30A and 30B mounted to the first cooling plate 22. The cooling medium is then directed through passages (FIG. 2) through the panel 16 to the second cooling plate 24. The second cooling plate 24 includes outlets 32A and 32 B that direct cooling medium through other portions of a cooling circulation system.

As appreciated, the cooling system may include a heat exchanger to dissipate heat absorbed by the cooling medium and a pump to power circulation of the cooling medium. Moreover, the example structural cold plate assembly 14 provides for the use of different cooling mediums such as different types of fluid in each of several separate circuits to provide desired thermal control capabilities. Further, although the example structural cooling plate assembly 14 includes two separate cooling circuits, one or more than two cooling circuits are also within the contemplation for use with the disclosed device.

Figure 2:
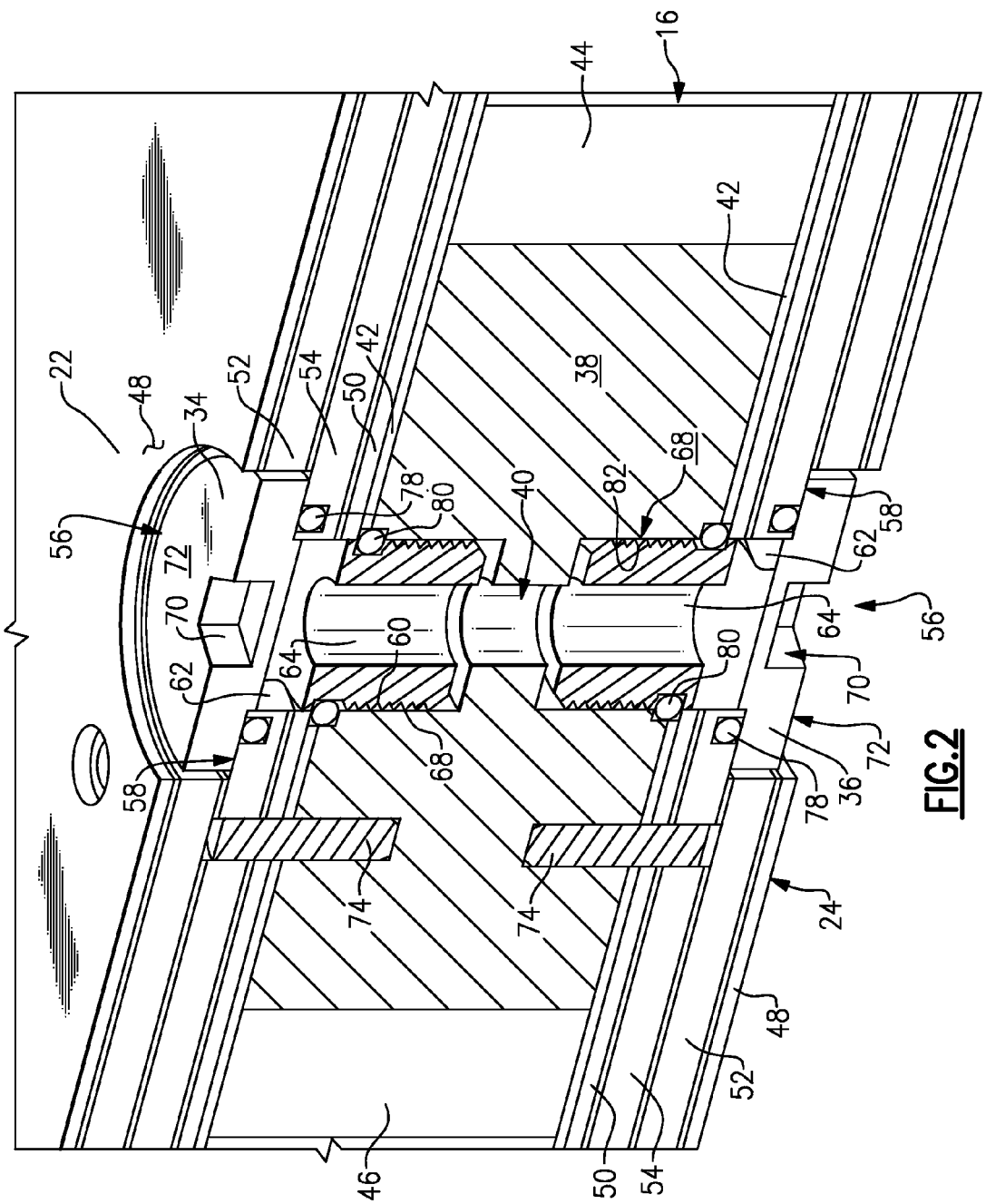
FIG. 2 is a sectional view of the example two-sided structural cold plate assembly including example threaded inserts.

Referring to FIG. 2, the example panel 16 includes face sheets 42 that are attached to top and bottom surfaces of several intermediate internal structures. The example panel 16 includes a honeycomb portion 46 that includes a plurality of open cells that is sandwiched between the face sheets 42. The open cell structure of the honeycomb portion 46 reduces the overall weight of the panel 16 while providing a desired structural integrity and strength. A frame structure 44 is also disposed between the face sheets 42 to provide a solid structure around the outer edges of the panel 16. The frame structure 44 also provides a location into which fasteners can be inserted.

The example face sheets 42 are adhered to the honeycomb portion 46 and the frame structure 44 by an adhesive. The example adhesive is selected to provide the desired bond between the honeycomb portion 46, the frame structure 44 and the face sheets 42 throughout the environmental operating range of the structural cold plate assembly 14.

The first and second cold plates 22, 24 each include two separate fluid circuits. Each of the first and second cold plates includes a top cover 48 and a bottom cover 50. Fluid circuit plates 54 and 52 are sandwiched between the top and bottom covers 48, 50. Each of the fluid circuit plates 54, 52 define a portion of a passage through which a cooling medium flows. The cooling medium can include a cooling fluid, air, or gas along with a combination of fluid, air and gas that facilitate the removal of heat generated by the devices 26.

The example structural cold plate assembly 14 includes a passage 40 through the panel 16. The passage 40 is defined through a mount portion 38. The mount portion 38 is positioned within the panel 16 and includes machined features for receiving first and second inserts 34, 36. In the disclosed example the mount portion 38 includes internal threads 60 that mate with threads 68 of the inserts 34, 36. The first and second inserts 34, 36 secure the corresponding cold plate 22, 24 to the panel 16 and further define a portion of the fluid passage through the panel 16. As appreciated, the inserts 34, 36 secure a portion of the cold plates 22, 24. Additional fastener may also be utilized as required to secure the cold plates 22, 24 to the panel 16.

The mount portion 38 also receives alignment pins 74 that extend upward into a corresponding opening in each of the cold plates 22, 24. The inserts 34, 36 include a threaded portion 68 that threadingly engages corresponding threads defined in the mount portion 38. A longitudinal cavity 64 extends through a portion of each insert 34, 36 and is intersected by windows 62. Cooling fluid from the cold plate 22 flows through the windows 62 into the longitudinal passage 64 into the passage 40 and through the second insert 36 into the second cold plate 24.

Figure 3:
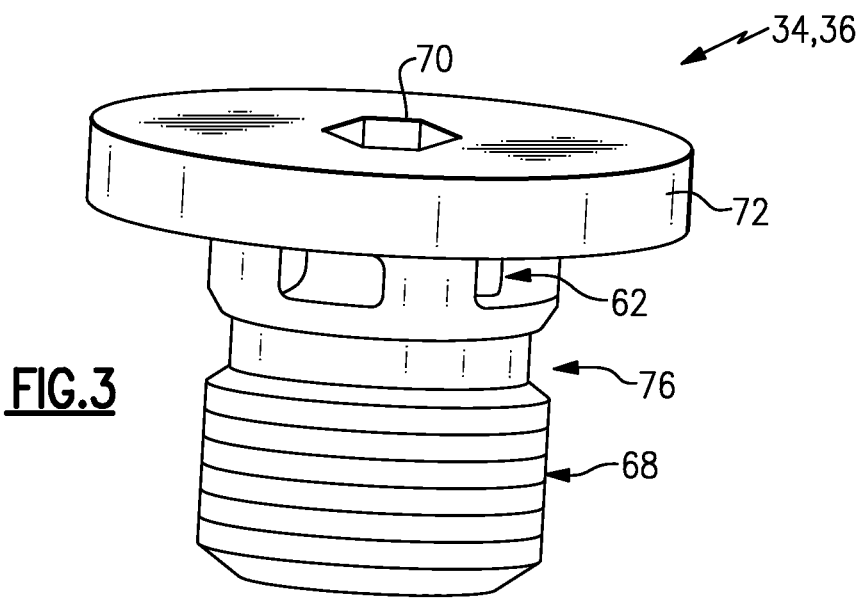
FIG. 3 is a perspective view of an example threaded insert.
Figure 4:
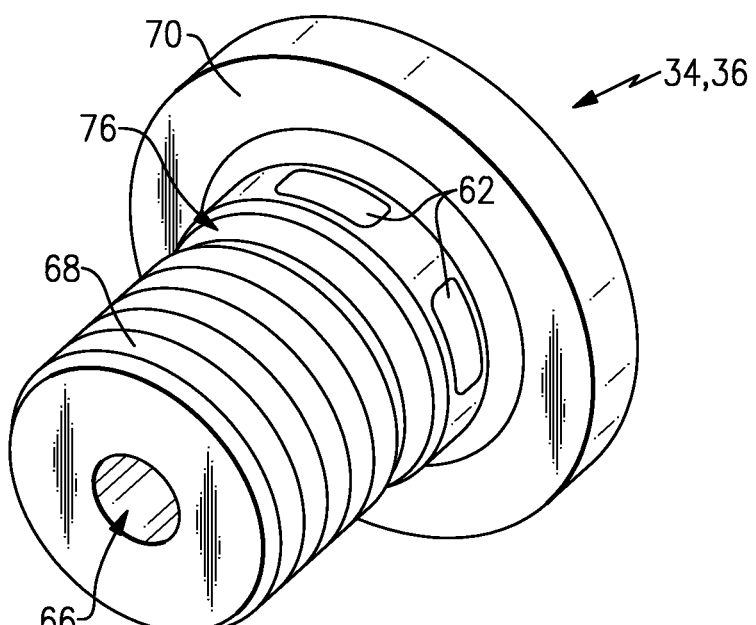
FIG. 4 is another perspective view of the example threaded insert.

Referring to FIG. 3 with continued reference to FIG. 2, the inserts 34, 36 each include a cap 72 that includes a hex opening 70 for receiving a tool to tighten the insert into the mount portion 38. Although a hex opening 70 is disclosed, other shapes that correspond with other tool configuration could also be utilized within the scope of this disclosure.

Each of the inserts 34, 36 include a seal groove 76 on which the seal 80 can be mounted. The seals 78 and 80 are provided on each of the inserts 34, 36 to provide a fluid or airtight seal between the mount portion 38 and the corresponding part of the cold plate. The example seals 78, 80 are o-rings that are mounted into corresponding o-ring grooves on the insert and the corresponding circuit plate. As appreciated, other seal configurations could be utilized within the scope of this disclosure.

The example inserts 34, 36 include the longitudinal passage 64 that terminates at one end at an opening 66 and dead ends at the cap 72 on another end. The windows 62 open transverse to the longitudinal passage 64 and communicate cooling medium transverse to the longitudinal passage 64.

Each of the cold plates 22, 24 includes an opening 56 through which the corresponding insert 34, 36 is installed. In this disclosed example, the opening 56 extends through the top plate 48 and the first circuit plate 52. The opening 56 through the top plate 48 and first circuit plate 52 is defined to receive the diameter of the cap 72. The circuit plate 54 includes an opening large enough to receive the threaded portion such that a bottom portion of the cap 72 engages a ledge 58 of the circuit plate 54 and compresses the seal 78 sufficiently to provide the desired seal.

In this example each cold plate 22, 24 includes two fluid circuit plates 52, 54. The example cap 72 extends through the fluid circuit plate 52 to align the windows 62 with the second fluid circuit plate 54. Thereby fluid from the second fluid circuit plate 54 is permitted to flow through the windows 62 and into the longitudinally passage 64 that leads further to the second cold plate 24. The example inserts 34, 36 can also be configured to provide fluid communication between the first fluid circuit plates 52 of each corresponding cold plate 22, 24. In other words, another set of inserts 34, 36 can be provided within the example structural cold plate assembly 14 that aligns windows 62 with the specific ones of the fluid circuit plates 52, 54 that defines the desired fluid passage between fluid circuit plates in the different cold plates 22, 24.

The seal 80 provides sealing of between the inserts 34, 36 and the cold plate 22, 24 to further seal against leakage past the threads 68. The specific thread configuration between the threads 68 of each insert 34, 36 and the mount portion 38 provides not only a desired sealing feature, but also provides for securing each of the cold plates 22, 24 to the panel 16. Because the threaded inserts 34, 36 are utilized for securing the cold plates 22, 24 to the panel 16, it remains possible to disassemble each of the cold plates 22, 24 from the panel 16 by unthreading the corresponding inserts 34, 36.

Alternatively, each of the inserts 34, 36 could also be welded to both provide a seal and to prevent disassembly. A weld can be provided at an interface between the outer circumference of the cap 72 and the adjacent circuit plate 54, or top plate 48.

Figure 5:
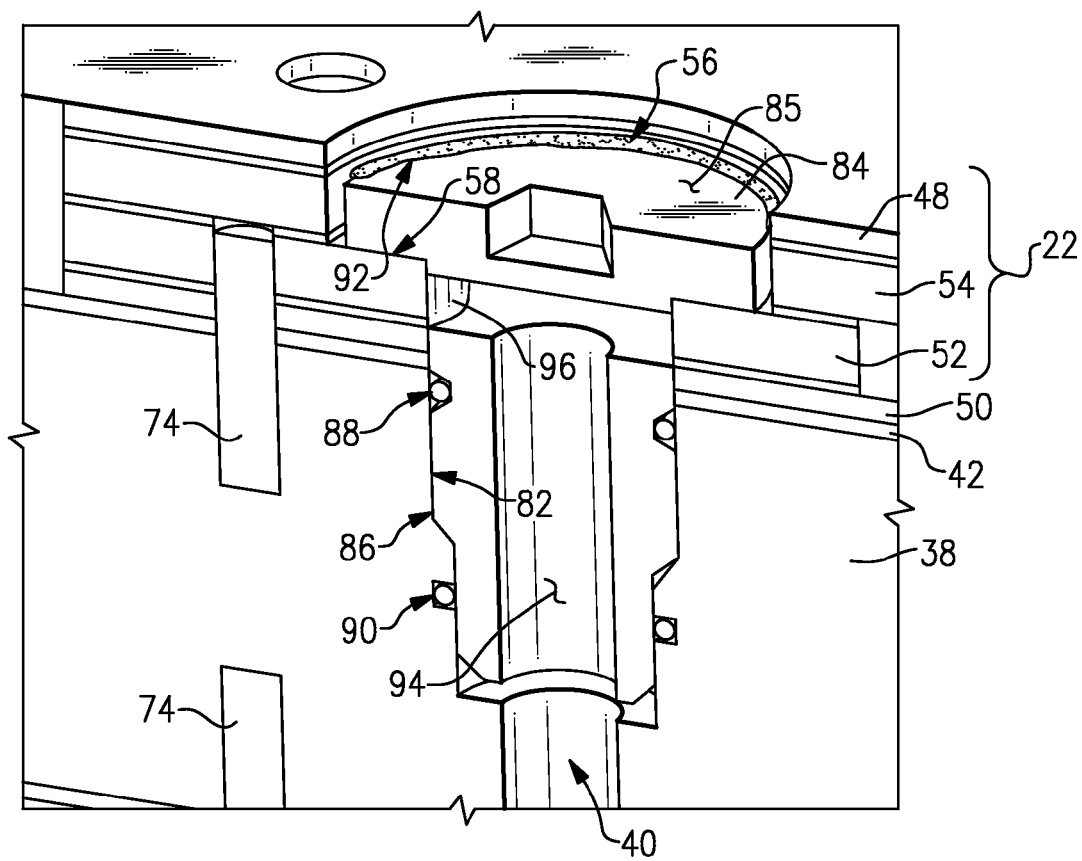
FIG. 5 is a sectional view of another example-threaded insert.

Referring to FIG. 5, another example insert 84 includes a cap 85 that is welded about its outer perimeter to form the desired seal. In this example an electron beam welding process is utilized to form a weld 92 between the outer circumference of the cap 85 and the circuit plate 54. The weld 92 provides the desired seal and therefore no seal is provided between the bottom surface of the cap 85 and the circuit plate 52 as is disclosed in the previous example. The insert 84 includes seals 88 and 90 that are disposed at the top and bottom of the threads 86. The threads 86 engage corresponding threads 82 on the mount portion 38 to both hold the insert 84 and cold plate 22 in place. The example insert 84 includes windows 96 that intersect longitudinal passage 94 to define a portion of the passage 40.

The example structural cooling plate assembly 14 is fabricated by first assembling the panel 16. The example panel 16 is assembled by bonding the top and bottom face sheets 42 to the honeycomb portion 46 and frame structure 44 and the mount portion 38. The mount portion 38 is positioned where the inserts are desired. The example panel 16 bonds the face sheets 42 to the surfaces utilizing an adhesive. As appreciated other bonding processes such as brazing could also be utilized. The face sheets 42 can be fabricated from sheet metal material along with other sheet materials that provide the desired structure and strength properties.

The first and second cold plates 22, 24 are then assembled to include the desired circuit configurations. The example cold plates 22, 24 include two circuit plates each that separate fluid circuits that will be connected by the fluid passage through the panel. The cold plates 22, 24 are mounted to the panel 16. The openings 56 are then either created, or aligned through each of the cold plates 22, 24 and aligned with each other. In the example, the cold plates 22, 24 are aligned by engaging the pins 74. Once the cold plates 22, 24 are aligned, the inserts 34, 36 are installed. The installation of the inserts 34, 36 include mounting of the seals 78, 80 and threading the insert 34, 36 into the corresponding threads of the mount portion 38. With the inserts 34, 36 installed, a passage between both cold plates 22, 24 are formed. The inserts 34, 36 can then remain in the threaded condition that provides for disassembly if desired. Alternatively, the insert can be welded in place to prevent disassembly and provide a desired seal.

Accordingly, the example structural cold plate assembly 14 provides a two-sided thermal control structure that is built into the support structure and that reduces the number of exposed fluid conduits and connectors. Moreover, the integral structure of the disclosed structural cold plate assembly 14 aids in assembly and reduces overall package size and weight.

Although an example embodiment has been disclosed, a worker of ordinary skill in this art would recognize that certain modifications would come within the scope of this disclosure. For that reason, the following claims should be studied to determine the scope and content of this invention.

What is claimed is:

1. A cold plate assembly comprising:
 a support structure including first and second opposite sides, wherein the support structure includes a mounting portion disposed between the first and second opposite sides;
 a first cold plate and a second cold plate, the first cold plate mounted to the first side of the support structure and the second cold plate disposed on the second side of the support structure; and
 a first insert and a second insert, the first insert extending through the first cold plate and threaded into the mounting portion from the first side, the second insert extending through the second cold plate and threaded into the mounting portion from the second side, and a fluid passage between the first cold plate and the second cold plate through the mounting portion, wherein the first insert and the second insert define portions of the fluid passage within the mounting portion between the first cold plate and the second cold plate.

2. The cold plate assembly as recited in claim 1, wherein the first insert and the second insert comprise a threaded portion that engages threads defined within the support structure.

3. The cold plate assembly as recited in claim 1, wherein the first insert and the second insert comprise a cap portion that seals an opening through the at least one cold plate and partially secures the cold plate to the support structure.

4. The cold plate assembly as recited in claim 1, the first insert and the second insert include a longitudinal cavity and an opening transverse to and in fluid communication with the longitudinal cavity.

5. The cold plate assembly as recited in claim 1, including at least one seal supported on the first insert and the second insert for sealing against one of the support structure and the a corresponding one of the first cold plate and the second cold plate.

6. The cold plate assembly as recited in claim 1, including at least one alignment pin for positioning at least one of the first cold plate and the second cold plate on the support structure.

7. The cold plate assembly as recited in claim 1, wherein the support structure includes a portion of the fluid passage and an interface surface that engages one of the first insert and the second insert.

8. A support structure comprising:
 a panel including a first side and a second side, wherein the panel includes a mounting portion and a frame portion disposed between the first side and the second side;
 a first fluid circuit supported on the first side of the panel;
 a first insert extending from the first fluid circuit and threaded into the mounting portion from the first side;
 a second fluid circuit supported on the second side of the panel; and
 a second insert extending from the second fluid circuit and threaded into the mounting portion from the second side, wherein the first and second inserts define a portion of a fluid passage within the mounting portion between the first and second fluid circuits, wherein each of the first and second inserts comprise a longitudinal passage intersected by a transverse opening that define a portion of the fluid passage between the first and second fluid circuits.

9. The support structure as recited in claim 8, wherein the panel comprises a honeycomb portion disposed between the first side and the second side and the first side of the panel is defined by a first face sheet and the second side of the panel is defined by a second face sheet.

10. The support structure as recited in claim 9, wherein the fluid passage is at least partially defined through the mounting portion.

11. The support structure as recited in claim 10, wherein each of the first and second inserts includes a threaded portion that engages a corresponding threaded portion within the mounting portion.

12. The support structure as recited in claim 10, including a seal disposed between a portion of each of the first and second inserts and the mounting portion.

13. The support structure as recited in claim 8, wherein the first fluid circuit is defined within a first cold plate and the second fluid circuit is defined within a second cold plate.

\* \* \* \* \*